United States Patent [19]

Smith et al.

[11] 4,175,257
[45] Nov. 20, 1979

[54] MODULAR MICROWAVE POWER COMBINER

[75] Inventors: Peter W. Smith, Westport; Rudolph G. Mastrioanni, Stratford, both of Conn.

[73] Assignee: United Technologies Corporation, Hartford, Conn.

[21] Appl. No.: 839,727

[22] Filed: Oct. 5, 1977

[51] Int. Cl.$^2$ ............................................. H03F 3/60
[52] U.S. Cl. ..................................... 330/287; 330/56; 330/61 A; 331/56; 331/107 P; 333/137
[58] Field of Search ...................... 330/56, 61 A, 287; 331/56, 96, 107 R, 107 P

[56] References Cited

U.S. PATENT DOCUMENTS

| | | | |
|---|---|---|---|
| 3,378,789 | 4/1968 | Gerlach | 331/56 X |
| 3,582,813 | 6/1971 | Hines | 330/287 X |
| 3,962,654 | 6/1976 | Corrons et al. | 331/56 |

Primary Examiner—Lawrence J. Dahl
Attorney, Agent, or Firm—Richard P. Lange

[57] ABSTRACT

A modular microwave power combiner having a plurality of identical microwave diode amplifier circuits grouped in sets within the body of a modular unit which are electrically coupled in parallel to a central cavity sized to be resonant at a single frequency to minimize mismoding thereby enhancing combiner efficiency. A number of waveguides are provided for coupling of the microwave diode in each amplifier circuit to the resonant cavity, and the waveguides are situated on one side of a PC board at the top of each modular unit. Since each of the modular units is essentially identical in physical size and shape, the overall power output of the power combiner can be increased by merely adding additional modular units. The individual modular units are sized to fit top-to-bottom such that the respective resonant cavities are spaced apart by one-half wavelength ($\lambda/2$) for the parallel electrical coupling of all of the resonating cavities. Each modular unit further includes a water jacket around the diode mounts for conducting heat away from the microwave diode thereby increasing circuit density and decreasing overall housing size.

22 Claims, 7 Drawing Figures

MODULAR MICROWAVE POWER COMBINER

BACKGROUND OF THE INVENTION

1. Field of the Invention

This invention relates generally to devices which combine high frequency electrical energy from a plurality of microwave sources and, more particularly, to a power combiner which combines microwave power from the resonant cavities of a plurality of axially adjacent modular units, each of the modular units receiving power into a central resonant cavity from a number of circumferentially disposed microwave sources.

2. Description of the Prior Art

With the advent of advanced types of electromagnetic systems operating in the microwave frequency ranges, many different techniques have been employed to introduce semiconductor technology with its high reliability, small size, and low voltage characteristics to the generation of microwave power. Most present day power combining solid state apparatus involves the use of microwave diodes employed in either an amplifier or an oscillator circuit which operate at a very high frequency. A final output stage will typically have a number of such circuits, and the outputs from all of the circuits are connected in parallel to provide the desired level of output power. One technique for electrically coupling such circuits in parallel is to position these circuits around the periphery of a central cavity such that electromagnetic energy from each circuit propagates into the cavity to resonate with increased amplitude. Since spurious frequency generation and multiple moding of the cavity increases as a function of the cavity size, it is desirable to employ as small a cavity as possible to minimize mismoding and to optimize efficiency. However, a high output power requirement means a large number of diode circuits and thus considerations, such as the size of the individual diodes, the precise configuration of the associated waveguides, type of coupling to the cavity, and operating frequency are significant factors governing the overall physical size of the power combiner. Another factor to be considered is the relatively low output-to-input power ratio of the diodes operating in the microwave frequency range which has meant that power amplification most often involves cascading of stages, the later stages having more and more discrete individual microwave circuits. Accordingly, many different approaches to microwave power combining have been advanced to alleviate the inherent bulk and coupling problems associated with the large numbers of microwave circuits employed in the final amplifier stages.

One prior art technique utilizes a circuit approach towards power combining and is known as the "tree" technique. In this combining technique individual power sources at the first power level are grouped in pairs and have their outputs combined via waveguide to a second and higher power level. Similarly, at this second level inputs are again grouped in pairs and are combined via waveguides to form a higher power level with one-half of the original number of output leads. This technique of coupling the waveguides in parallel is repeated at successive power levels until a single waveguide output emerges at the last and highest power level. While in theory there is almost no limit to the number of microwave sources whose outputs can be combined in this manner, the practical limitations imposed by the overall size and cost of such a combiner make this approach undesirable.

Another technique for combining microwave power is to use a combiner with a separate input and output port having an elliptical cavity and a plurality of individual diode circuits positioned around the perimeter of the cavity. U.S. Pat. No. 3,873,935 issued Mar. 25, 1975 to H. Oltman, describes one such device and it shows a housing employing a plurality of elliptical cavities stacked in an axially adjacent configuration. Each cavity is shaped essentially as a right elliptical cylinder and receives an input microwave signal at the input focus. Microwave energy radiates radially outward from the input focus to the diode circuits around the periphery of the elliptical cavity. After amplification by the diode oscillator circuits, the microwave energy is reflected radially inwardly to the other focal point of the cavity which is connected to the output transmission line. A disadvantage of this elliptical structure is that the inherent noncircular configuration means that some of the diode locations are not symmetrically situated with respect to the cavity focal points and this causes interference patterns as microwave energy propagates to and from the peripheral locations. As a result, the electromagnetic fields arriving at the output focal point have a tendency to be slightly out of phase and therefore not totally additive, thereby reducing power combiner efficiency. Another disadvantage of the elliptical cavity concept is that both the individual diode circuits in each elliptical cavity do not operate under identical conditions of impedance and power level and this increases the likelihood of multimoding which also decreases unit efficiency.

Still another prior art approach to microwave power combining utilizes a plurality of oscillator circuits, each having a diode positioned at precisely spaced apart positions along the walls of a rectangular shaped cavity resonator. In U.S. Pat. No. 3,628,171 issued Dec. 14, 1971 to K. Kurokawa for MICROWAVE POWER COMBINING OSCILLATOR CIRCUITS microwave power from each individual diode circuit is radiated into the common central cavity. The spacing of the diodes along the cavity sidewall is particularly critical and the distance separating adjacent diodes must be within close tolerances to avoid multi-mode operation. Furthermore, the rectangular combining cavity is inherently large and bulky and it must be rather long to achieve acceptable microwave power levels since only two diode circuits can be accommodated at each station along the cavity spaced by multiples of one-half waveguide wavelength.

Yet another approach is described in U.S. Pat. No. 3,931,587 issued Jan. 6, 1976 to Harp et al. for MICROWAVE POWER ACCUMULATOR in which microwave power is combined in a center cylindrical cavity from a plurality of diode oscillator positioned around the cavity periphery. Power flow is directed from the diodes inwardly where it is combined in the central resonant cavity and is transmitted out of the unit by the single port. A disadvantage of this particular microwave power combining unit is that in order to operate the combining cavity at the most desirable mode for minimizing spurious oscillations, there is a limited number of circuits which can be disposed around the cavity periphery. Accordingly, to increase the power output of this accumulator, more diodes must be used and the size of the cavity will necessarily be increased to accommodate the additional oscillator circuits around its perimeter. Of course, with increased diameter the cavity will be designed to resonate at a higher mode increasing the possibility of mismoding and loss in efficiency.

SUMMARY OF THE INVENTION

It is the object of the present invention to provide a novel microwave power combiner with a unique housing which not only combines the output electrical energy from a plurality of individual microwave sources disposed around the periphery of each modular unit but also from a number of resonant cavities within axially adjacent modular units so that a single modular unit having a fixed output power capability is the basic building element of a high level power combiner.

According to the present invention, a small cavity of each individual modular unit resonates at the mode of lowest spurious emissions to combine radiated energy from a plurality of diode amplification circuits disposed around the periphery of the housing. To add additional microwave amplifier circuits, another modular unit is axially coupled so that the overall cavity and housing diameters are not increased. A high circuit packing density is also maintained by a cooling chamber which is provided around the cylindrical wall of each modular unit.

A particular advantage of a modular microwave power combiner according to the present invention is that each individual modular unit can be tuned for a maximum operating efficiency during assembly and then any number of similarly tuned modular units can be connected together depending on the overall power level required. For example, where cascading stages in an amplifier to increase the output power level, successive stages can be formed from a larger and larger number of identical individual modular units thereby correspondingly increasing the number of parallel coupled microwave diode circuits, e.g. first stage —one modular unit with 16 microwave diode circuits each having a power gain of 3, second stage —three modular units with 48 microwave diode circuits each having a power gain of 3, third stage —nine modular units with 144 microwave diode circuits each having a power gain of 3, until the desired final output power level is reached. Then, in this case, since all the diode circuits operate under identical conditions each stage can be formed from one modular unit.

According to yet another feature of the modular microwave power combiner of the present invention, the microwave circuit includes a radially extending waveguide structure for coupling the cylindrical resonant cavity to the microwave diodes, and this structure is formed by a strip transmission line on one face on a dielectric substrate thereby facilitating low cost manufacture and easy assembly of the combiner.

The foregoing and other objects, features and advantages of the present invention will become more apparent in light of the following detailed description of the preferred embodiment thereof, as illustrated in the accompanying drawing.

DETAILED DESCRIPTION OF THE PREFERRED EMBODIMENT

Figure 1:
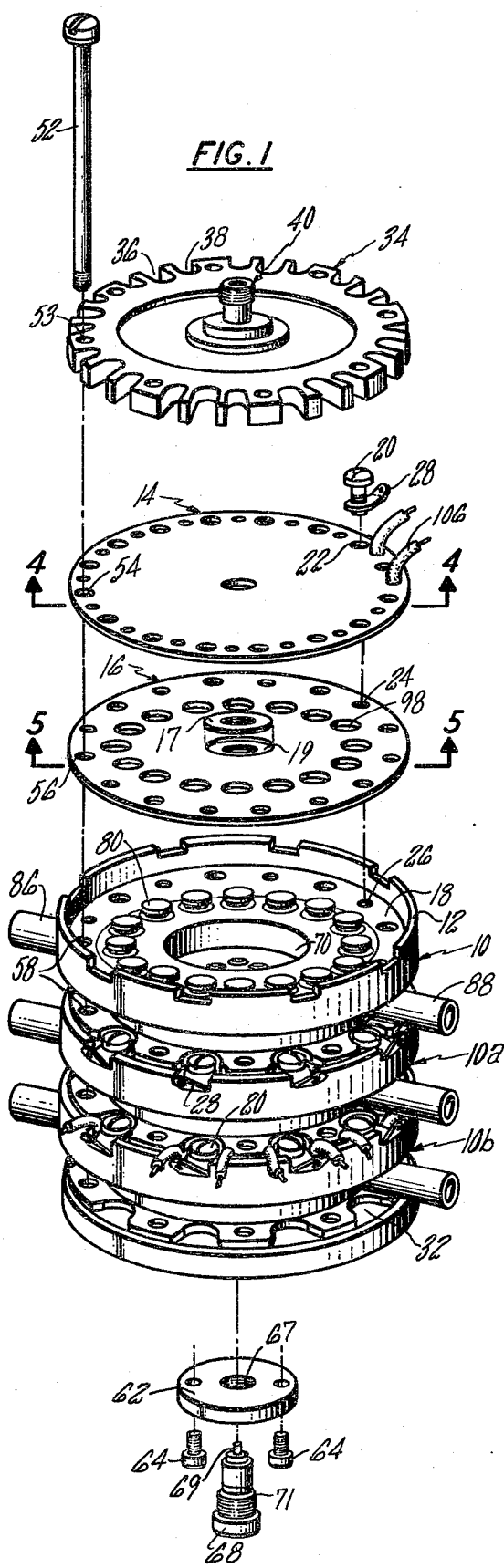
FIG. 1 is a perspective view of a modular microwave combiner according to the present invention, partially exploded, illustrating the modular construction.
Figure 2:
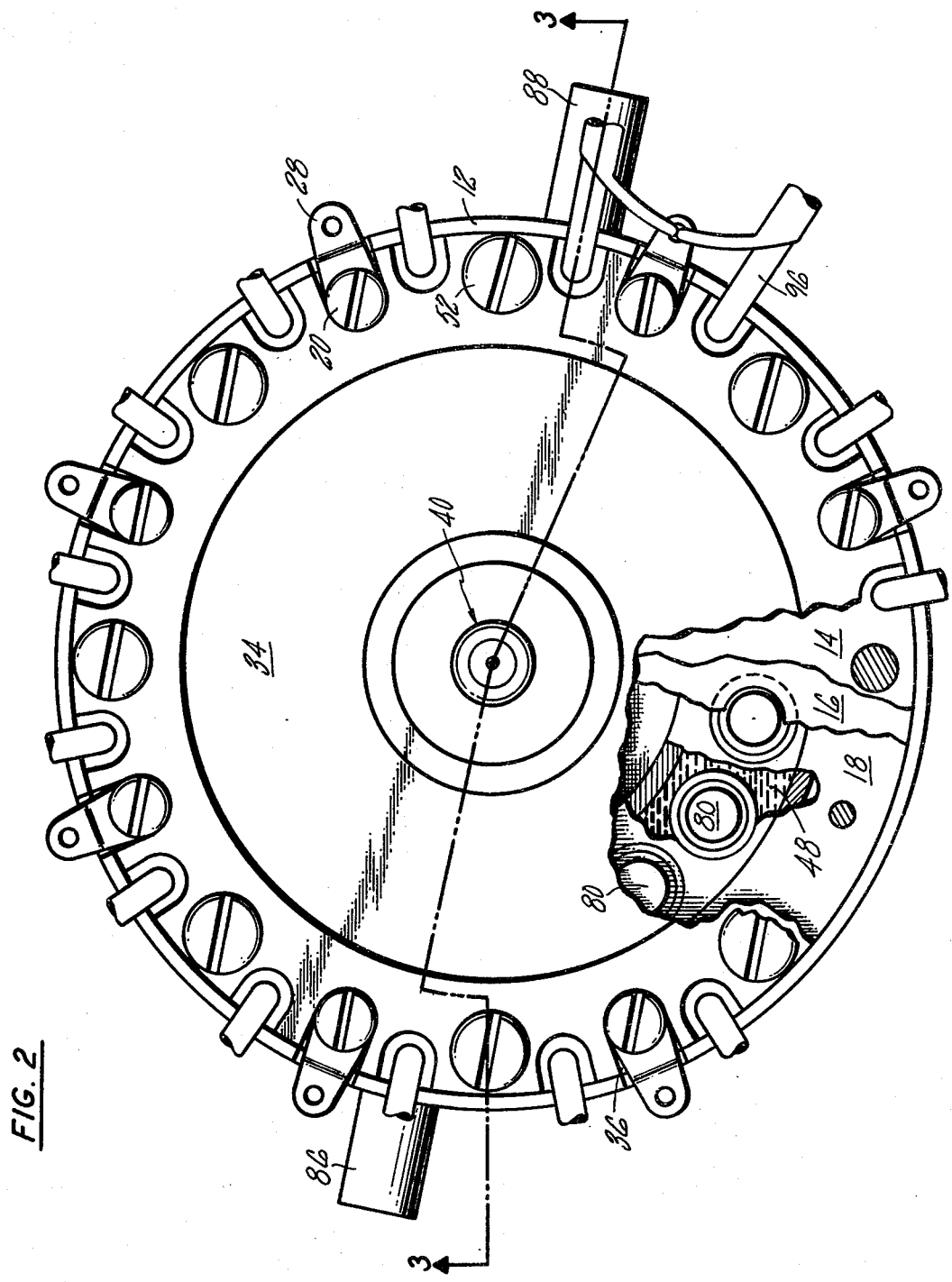
FIG. 2 is a top view of an assembled modular microwave power combiner with a portion of the housing cut away illustrating the individual diodes disposed around the cylindrical resonant cavity.
Figure 3:
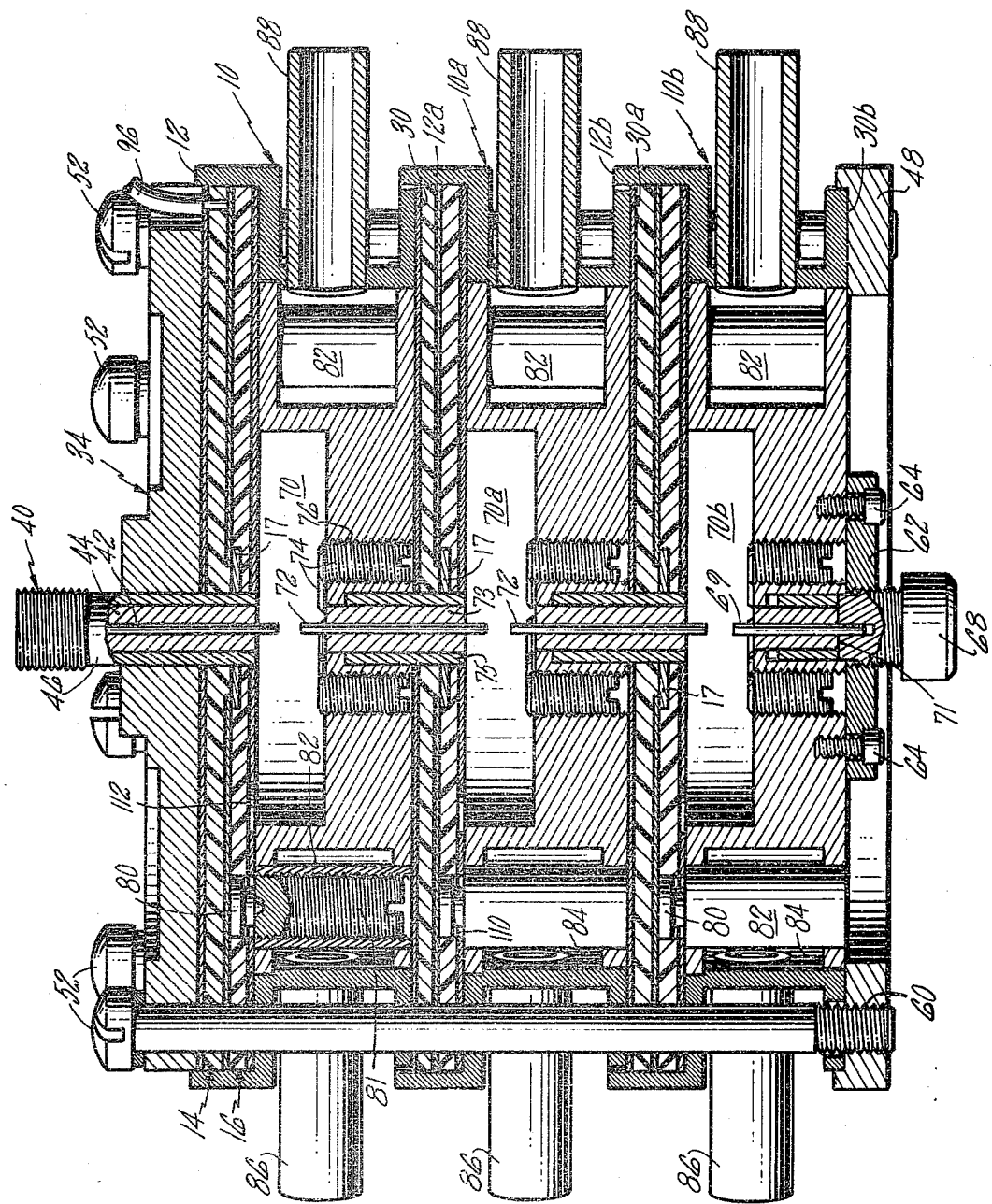
FIG. 3 is an axial section of the modular microwave combiner taken along lines 3—3 of FIG. 2 illustrating the internal configuration of each modular unit.

Referring initially to FIGS. 1-3, a modular microwave power combiner according to the present invention is shown. In the illustrated form, a modular microwave power combiner comprises a plurality of individual modular housings 10 fabricated from a metal such as brass or aluminum which have a relatively high coefficient of electrical and thermal conductivity. Each modular housing 10 is ideally cylindrically shaped having a rim 12 at its upper end extending circumferentially around the top of the housing perimeter. An upper PC board 14 and lower PC board 16 (both described in greater detail hereinafter) are situated in the circular area defined by rim 12 and the latter fits against a planar surface 18. As best seen in FIG. 1, a disk 17, fabricated from a material which absorbs microwave energy, is situated in a recess 19 in the lower PC board 16 and it contacts the underside of the upper PC board 14. A plurality of screws 20 extend through an opening 22 in the upper PC board 14 and an opening 24 in lower PC board 16 to a corresponding number of threaded openings 26 in recessed surface 18. When tightened down (FIG. 3), the screws 20 provide good electrical contact between the microwave amplifier circuit components disposed on the upper PC board 14, the lower PC board 16, and those within modular housing 10. A lug 28 is provided under the head of each screw 20 (FIGS. 1 and 2) and is soldered or otherwise connected to an external source of ground potential (FIG. 2) such as the outer shield of a coaxial cable to insure an electrical return path for the bias supply.

At the bottom of each modular housing 10, a planar lower surface 30 (FIG. 3) is sized to be slightly smaller in diameter than upper surface 18 so that, when disposed axially adjacent the top of another modular housing 10a, the lower surface 30 fits inside the rim 12b and contacts the top surface of the upper PC board 14. A plurality of notches 32 are symmetrically spaced about the lower end of the housing periphery (FIG. 1) and provide space for both the heads of the screws 20 and electrical wires leading into the axially adjacent modular unit.

At the upper end of each modular unit 10, a top plate 34 is sized to fit within the rim 12 against the upper surface of the upper PC board 14. A plurality of circular notches 36 are symmetrically spaced about the perimeter of the top plate 34 and, together with a pair of additional notches 38 situated on either side of each notch 36, provide room for the screws 20 and electrical perimeter wires, respectively, of the unit. At the center of top plate 34, a connector 40 is provided and serves as a single input/output port for the propagation of microwave energy to and from the microwave power combiner. As is best seen in FIG. 3, the connector 40 includes a short section of transmission line having a central conductor 42 surrounded by a dielectric 44, both of which are disposed within a metallic outer conductor 46. The upper end of the outer conductor 46 may be suitably threaded to engage the coupling of an external transmission line through which microwave energy propagates in the well known manner.

At the bottom of the modular microwave power combiner, a ring 48 is provided and it has a recessed surface on its upper face size to snugly receive the outside portion of the bottom surface 30b (FIG. 3). A plurality of spaced screws 52 extend through a corresponding number of openings 53 in top plate 34, openings 54 in upper PC board 14, openings 56 in lower PC board 16 and aligned openings 58 in the modular housings 10 where they are received in threaded openings 60 spaced about bottom ring 48 at the lower end of the combiner. Of course, it should be understood that each set of screws 52 would be sized to accommodate whatever number of modular housings 10 (i.e., 10, 10a and 10b) which are employed in a particular power combiner as determined by the desired microwave output power.

At the center of the bottom of the housing, an end plate 62 (FIGS. 1 and 3) is provided and is held against the lower surface 30b by a pair of screws 64 threadably received in a pair of internally threaded openings. A central opening 67 disposed along the axis of the plate 62 is also internally threaded and it rotatably receives the correspondingly threaded shank of an end cap 68. A probe is fixedly mounted in end cap 68 and extends axially from a grounding plane formed by the radially planar surface 71. The central conductor 69 of the probe is enclosed in a short section of dielectric material which is in turn surrounded by a metallic outer conductor and, when in position in end plate 62 (FIG. 3), electrically terminates the standing wave in the power combiner.

Referring now primarily to FIGS. 1 and 3, a central cavity 70 is formed along the axis of each modular housing 10. As is seen, the cylindrical sidewall and one end wall are formed by a recessed area which communicates with the surface 18 and this area together with the lower surface of the lower PC board 16 creates a closed right cylinder which serves as a resonant cavity to electrically combine microwave power from the individual amplifier circuits in each modular housing 10 and it also receives microwave energy from axially adjacent modular units, if any. The diameter and height of the cavity 70 are particularly important and it is preferably dimensioned in order that it will resonate in the circular symmetrical $TM_{010}$ mode, a condition well known to those of ordinary skill in the art in which the cavity is resonant at essentially a single frequency while spurious resonances at other frequencies are suppressed. The cavity walls may be plated with a highly conductive metal such as silver and this coating would be protected by a thin layer of rhodium which protects the silver against oxidation.

Where the output power requirement is such that a large number of amplifier circuits must be employed to obtain the desired output power level, additional modular units 10 are utilized, and electrical coupling between axially adjacent resonant cavities includes a coupling probe which is essentially a short section of coaxial transmission line disposed in an opening formed along the axis of each modular housing 10. As best seen in FIG. 3, the center conductor 72 of the coupling probe is surrounded by a dielectric material 73 and outer sheath 75 so that the outward end of the coupling probe extends into the adjacent cavities. The thickness of each modular housing unit 10, together with the upper PC board 14 and the lower PC board 16 are particularly sized in order to ensure that the spacing between the reference planes of axially adjacent resonant cavities is one-half wavelength ($\lambda/2$) or multiples thereof.

Radially outward from the coupling probe is a plurality of tuning screws 74 which are symmetrically disposed about the housing axis in a corresponding number of axially directed openings 76. The tuning screws 74 may be individually adjusted thereby providing a means by which the precise frequency of resonance in the cavity can be initially set to predetermined tolerances.

Still referring primarily to FIGS. 1 and 3, radially outward from the cavity 70 in each modular housing is a plurality of microwave diodes 80, such as an impact avalanche transit time (IMPATT) diode or equivalent, symmetrically spaced about the central axis. Each diode 80 is held by a mount 81, fabricated from a cylindrical stock having a high coefficient of heat transfer, and is sized to fit tightly in a threaded tube 82 which is disposed in an axially extending opening formed between the upper surface 18 and the lower surface 30 in each housing. The outer sidewall of the mount 81 is threaded as is the inside of tube 82 to seat diode 80 against upper PC board 14 and to provide a tight fit therebetween so that heat will be readily conducted away from the microwave diode 80. An annular space 84 (FIGS. 2 and 3) extends circumferentially around each modular housing. An inlet 86 on one side of the housing and an outlet 88 on the opposite side of the housing both communicate with space 84 so that a liquid coolant, such as water or the like, can flow through space 84 during operation of the power combiner to remove the heat generated by the diodes.

Figure 4:
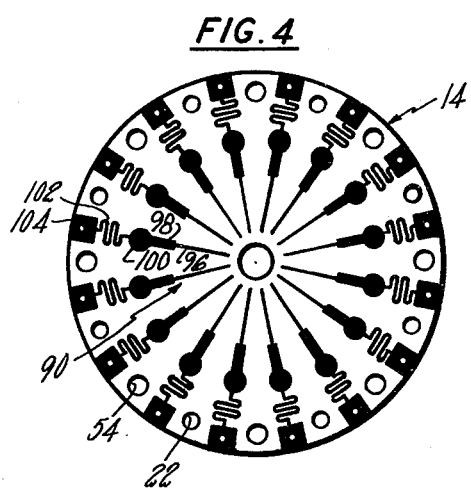
FIG. 4 is a view taken along line 4—4 of FIG. 1 and shows the bottom face of the upper PC board with the waveguide structure deposited thereon.

Referring now to FIG. 4, there is seen the lower face of the upper PC board 14 on which the waveguide structures which couple each microwave diode 80 to the cavity 70 are disposed. A particular advantage of the modular microwave power combiner according to the present invention is that the waveguide structure connecting the components of the microwave amplifier circuit together can be integrally formed on a substrate by one of the well known methods which either deposit or remove a metal such as copper from the supporting substrate. The substrate itself is fabricated from a material which has a high dielectric constant and low microwave losses. A strip line 90 is provided for each microwave amplifier circuit and each strip line is ideally a few thousands of an inch thick at a first width. The inward end of each strip line contacts the absorber disk 17 (FIGS. 1 and 3) which absorbs unwanted spurious microwave energy. The strip line extends radially outward on the end face through the coupling point 96 the same constant cross-sectional dimension to a transformer 98. There, the strip line 90 changes width abruptly to a second width and extends for a distance corresponding to approximately one-quarter wavelength ($\lambda/4$) to form the transformer 98 which is an impedance matching element. A pad 100 at the radially outward end of the transformer 98 contacts the top of each diode 80 thereby electrically coupling the outward end of the strip line to the microwave diode. A choke 102, essentially a high frequency impedance, is formed from a copper film situated on the substrate in the manner illustrated and it extends from the diode pad 100 radially outward to a terminal 104, which may in turn be attached via a wire 106 (FIG. 1) to an external voltage source (not shown) to bias the microwave diode 80. The terminal 104, being separated from ground by the dielectric substrate, has the effect of a shunting capacitance and together with the choke 102, forms a high frequency filter which prevents any microwave signals from radiating out of the housing. At the center of the upper PC board 14 an opening 101 is provided through which a transmission line extends to electrically couple the axially adjacent resonant cavities.

Figure 5:
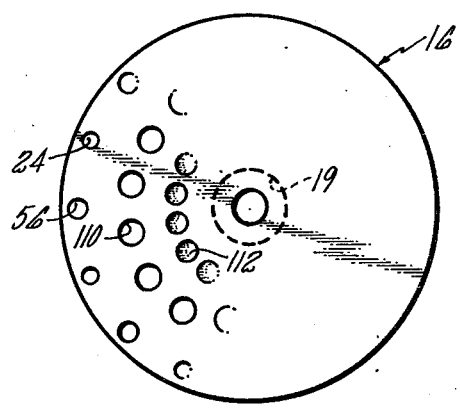
FIG. 5 is a view taken along line 5—5 of FIG. 1 and shows the bottom face of the lower PC board.

Referring now to FIG. 5, there is seen the bottom surface of the lower PC board 16. The PC board 16 is also fabricated from a material having the same high dielectric constant and low microwave losses, and a film of metal, such as copper, is integrally formed over the end face by any one of the well known methods for either etching from or depositing onto a substrate. In addition to openings 24 and 56 formed along its periphery to accommodate screws 20 and 52 by drilling or the like, a plurality of openings 110 are provided through the metallic film and the substrate which can be axially aligned with each diode. A port 112, which may be formed as an opening only through the metallic film, is radially alignable with the coupling point 96 of the strip line 90 on the upper PC board 14 creating the aperture through which each amplifier circuit is electrically coupled to the resonant cavity 70.

Figure 6:
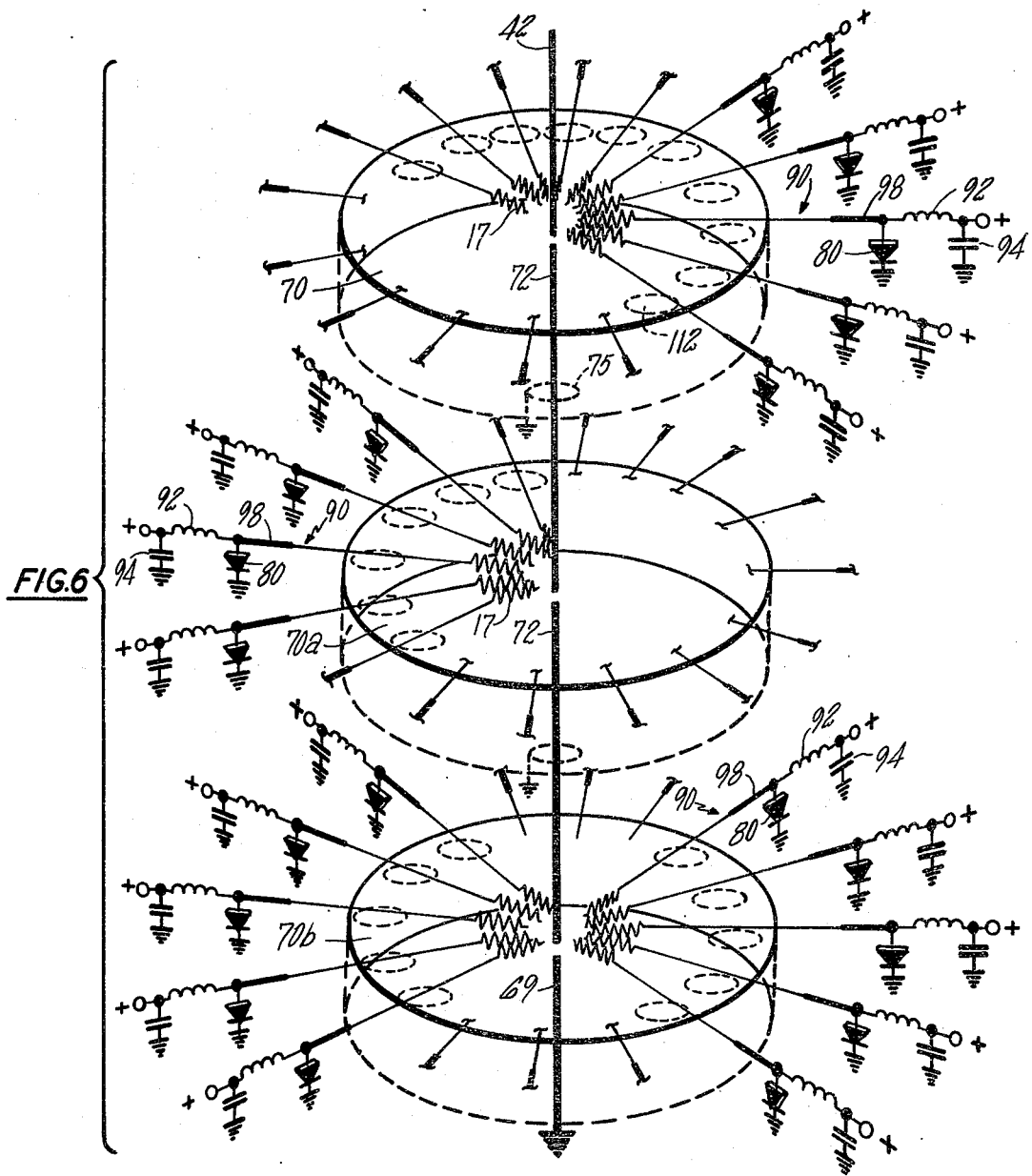
FIG. 6 is a partial schematic view illustrating the general spatial location of the amplifier circuit components within the modular microwave combiner.

Referring next to FIG. 6, there is shown a partial schematic illustrated which depicts the plurality of microwave amplifier circuits that provide the power gain in the power combiner of the present invention and their relationship to the cavity 70. As indicated herebefore, one of the particular advantages of the present invention is the ease and flexibility by which sets or groups of amplifier circuits can be electrically coupled together in the generation of a microwave output signal waveform of a desired power level. As is known, where high output power is required, the power amplifier stage generally consists of a number of cascaded amplifier units which raises the power level in a series of steps. Because individual microwave amplifier circuits have essentially a constant and maximum power output at a given gain, each successive power combiner stage normally has more microwave amplifier circuits than the prior stage and, in the prior art combiners this meant that where coupled in parallel by a resonant cavity, such a cavity must be larger and larger in size in successive stages to accommodate the increased number of microwave amplifier circuits. As is known, the larger the size of a cavity, the greater the likelihood of cavity mismoding or resonating at more than a single frequency which results in losses in efficiency.

Figure 7:
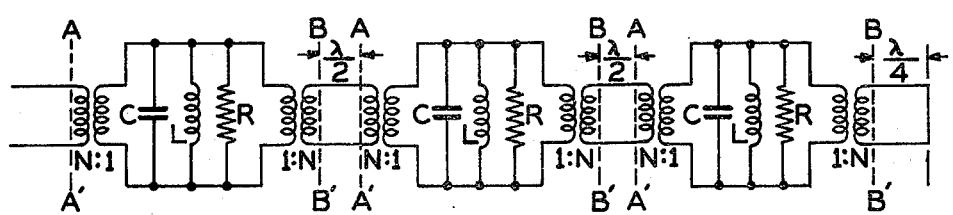
FIG. 7 is a schematic illustration of the equivalent circuit of the modular microwave power combiner shown in FIG. 6.

Referring finally to FIG. 7, there is seen an equivalent circuit of the modular power combiner of the present invention which is helpful in understanding its operation. Each cavity is represented by its intrinsic parameters of its equivalent capacitance, C, the equivalent inductance, L, and the effective equivalent resistance, R, which in operation will be understood by those of ordinary skill to be, as a result of the diode, an effective negative resistance. The cavity coupling through the end ports is represented by an N:1 and a 1:N transformer. The planes indicated at AA' and BB' are the reference planes of the detuned short circuit of each cavity. The resonant frequency of each cavity is initially set by presenting an input from a microwave circuit analyzer adjusting the tuning screws 74 as needed. Each unit is set to have the same resonant frequency so that at circuit resonance, the reactances of L and C exactly cancel. Since the affect of the IMPATT diodes coupled to the cavity is to provide a negative resistance, the gain for each cavity is a function of the square of the reflection coefficient. The gain for the power combiner as a whole, or for that matter of a power combiner with any number of modular units, is equal to the square of the overall equivalent reflection coefficient.

In operation, an input microwave signal from a circulator, or the like, propagates into the parallel coupled cavities 70, 70a, and 70b, this signal having the same frequency as the resonant frequency to which the cavities are tuned. Since the individual microwave circuits are parallel coupled to each cavity, electromagnetic energy propagates through each port 112 where it is coupled to the coupling point 96 in the strip line 90 for each microwave amplifier circuit. The negative resistance caused by the diode in each microwave circuit amplifies the resonating signal in the strip line 90 which, in turn, through the coupling port 112, enhances the electromagnetic field of the signal resonating within each cavity. The combined effect of all the microwave amplifier circuits disposed around each cavity, together with the parallel coupling of the cavities by the probes 72, is to enhance the power level resonating microwave signal which is reflected out of the power combiner to the circulator.

In manufacturing the power combiner according to the present invention, the individual modular units 10 which form a single power combiner should be adjusted to minimize any tendency toward mismoding and to achieve optimum input-to-output power gain. In accordance with one assembly method, with the upper PC board 14 and the lower PC board 16 in position, each modular unit 10 is fitted with a pair of symmetric probes so that the outward ends extend the same distance into the internal cavity 70. Then, the lower probe is terminated in a matched output load and the upper probe is connected to a network analyzer. By using a sweep frequency technique, the position of the plane of the detuned short circuit on the upper side (AA') is determined by ascertaining where the input impedance is resistive at resonance and zero far off-resonance. Next, the connections to the probes into the cavity are reversed and the same sweep frequency technique is employed to determine the other plane of the detuned short circuit (BB'). The axial spacing between adjacent modular units 10 is set so that the distance between the lower plane (BB') of one cavity and the upper plane (AA') of the next cavity is exactly one-half wavelength, e.g. at 10 gigahertz with a dielectric of $\epsilon_p=2.0$ a one-half wavelength distance corresponds to a spacing of 0.417 inches. In the event that the separation between adjacent modular units 10 is not as required, one or more spacers may be disposed between the lower surface of one housing and the top surface of the next housing to achieve the necessary spacing. With all of the modular units 10 positioned end-to-end, the housing screws 52, sized according to the number of modular units, are inserted through the top 34, each of the modular units, to the threaded opening in the ring 48, and are tightened to join the respective units. Finally, the end cap 68 is inserted in the bottom opening of the last or lowest modular unit, and the radial surface forming the short circuit plane is positioned precisely one-quarter wavelength from the cavity reference plane. The power combiner is now ready for electrical connection as a single port device in microwave circuit where it would be matched to the waveguide from a circulator or equivalent.

Although the invention has been shown and described with respect to preferred embodiments thereof, it should be understood by those skilled in the art that the foregoing and various other changes, omissions and additions thereto may be made therein, without departing from the spirit and the scope of the invention.

Having thus described typical embodiments of our invention, that which we claim as new and desire to secure by Letters Patent is:

1. A power combiner for microwave energy, comprising:
    a housing having at least one internal cavity disposed therein defined by a pair of facing end surfaces, said internal cavity being sized to resonate at a single frequency;
    diode means situated within said housing for providing a source of microwave energy;
    diode waveguide means positioned to extend radially within said housing, and having a coupling point situated axially adjacent one end surface defining said internal cavity, for electrically coupling said diode means to said internal cavity;
    aperture means disposed through one of said end surfaces defining said internal cavity, near the periphery thereof, and situated in axial alignment with said coupling point of said radial waveguide means for forming an opening to said internal cavity through which microwave energy can propagate;
    output means including an axially extending waveguide through one of said end surfaces defining said internal cavity for propagating microwave energy out of said power combiner; and
    means including an axially extending waveguide through the other one of said end surfaces for reflecting microwave energy back into said cavity.

2. A power combiner according to claim 1, wherein said power combiner includes an upper board sized to fit against one end of said housing, and wherein said diode waveguide means is a radially extending strip line disposed thereon.

3. A power combiner according to claim 2, wherein said power combiner includes an upper board sized to fit against one end of said housing, and wherein 4. A power combiner according to claim 3, further including a coupling transformer situated on said diode waveguide means for matching the electrical impedance of said diode means to said internal cavity.

5. A power combiner according to claim 4, wherein said strip line has a radially inward portion of a first cross-sectional size and a radially outward portion of a second cross sectional size, both of which are disposed on said upper board, and wherein said second cross-sectional size is greater than said first cross-sectional size forming said coupling transformer.

6. A power combiner according to claim 5, further including a pad situated at the radially outward end of said strip line on said upper board, and wherein diode means are mounted in said housing so that a portion thereof contacts said pad.

7. A power combiner according to claim 3, wherein said power combiner further includes a lower board having a conducting material thereon and sized to fit against said upper board, and wherein said aperture means is formed by an opening through at least said conducting material.

8. A power combiner according to claim 1, wherein said housing includes at least two internal cavities disposed in an axially adjacent configuration, each internal cavity being similarly sized for resonating at a common frequency.

9. A power combiner according to claim 8, wherein said power combiner further includes a transmission line situated in an opening along the axis of said housing for electrically coupling microwave energy between said internal cavities.

10. A power combiner according to claim 1 wherein said housing further includes a top surface and a bottom surface, and wherein said internal cavity is formed, in part, by a recessed area which communicates with said top surface.

11. A power combiner according to claim 10, further including a lower board having a conducting film on one side thereof for closing said recessed area forming an internal cavity, and wherein said aperture means is formed by an opening through said conducting film aligned with said coupling point of said diode waveguide means.

12. A power combiner according to claim 1, wherein said output means is a part of a top adapted to close the upper end of said housing, and wherein said output means is adapted to be connected to an external transmission line so that microwave energy can propagate out of said internal cavity.

13. A power combiner according to claim 1, wherein said means for reflecting microwave energy back into said cavity includes an end cap disposed in an axially extending opening from the bottom surface of said housing to said cavity, and wherein said end cap includes a radially extending surface which is positionable at a distance corresonding to one-quarter wavelength from the reference plane of said cavity.

14. A power combiner according to claim 1 wherein said housing further includes a plurality of axially extending openings equally displaced about the axis housing, and wherein a tuning screw is threadably received within each axially extending opening for tuning the resonant frequency of said cavity.

15. A power combiner according to claim 1, wherein said housing further includes a plurality of mounts equally displaced about the central axis of said housing, each mount being adapted to receive a microwave diode such as an impact avalanche transit time (IMPATT) diode.

16. A microwave power combiner according to claim 15, wherein said housing includes an annular chamber through which the diode mounts extend, and wherein an inlet to said chamber is provided on one side of said housing and an outlet is provided on the opposite side of said housing so that a liquid can be circulated through said chamber to cool said microwave diodes in operation.

17. A power combiner for microwave energy, comprising:
    a housing having at least two modlar units positioned in an axial adjacent configuration, each modular unit including an internal cavity sized to resonate at a single frequency;
    a plurality of diode means situated within each of said modular units for providing a source of microwave energy to said cylindrically shaped cavity;

diode waveguide means positioned on each of said modular units for guiding microwave energy between each of said plurality of diode means and said cylindrically shaped internal cavity;

cavity waveguide means positioned within said housing to extend axially between said internal cavities of axially adjacent modular units allowing microwave energy to propagate therebetween;

output means positioned at one end of said housing and coupled to said internal cavity of the end modular unit for allowing the propagation microwave energy out of said power combiner; and means situated at the other end of said housing for reflecting /microwave energy back into said internal cavity of said end modular unit.

18. A power combiner according to claim 17, wherein said diode waveguide means of each modular unit is a strip line mounted on an upper board which is sized to fit against one end of said housing.

19. A power combiner according to claim 18, wherein each of said strip lines on said upper board includes a coupling transformer to matching the electrical impedance of each of said diode means to that of said internal cavity.

20. A power combiner according to claim 19, wherein said strip line has a radially inward portion of a first cross-sectional size and a radial outward portion of a second cross-sectional size and a radial outward portion of a second cross-sectional size, thereby forming a coupling transformer.

21. A power combiner according to claim 18, wherein each modular unit further includes a lower board having a conducting material thereon which is sized to fit against said upper board forming one end face of said internal cavity.

22. A power combiner according to claim 21, wherein said lower board further includes a plurality of openings through said conducting material, and wherein each opening is aligned with one of said strip lines positioned on said upper board thereby coupling each of said diode waveguide means to said internal cavity.

* * * * *

UNITED STATES PATENT AND TRADEMARK OFFICE
CERTIFICATE OF CORRECTION

PATENT NO. : 4,175,257
DATED : November 20, 1979
INVENTOR(S) : Peter W. Smith and Rudolph G. Mastrioanni It is certified that error appears in the above-identified patent and that said Letters Patent are hereby corrected as shown below:

Column 7, line 68 - after "input" insert -- signal --

Claim 3, column 9, line 46 - Claim 3 as printed is incorrect.
Insert Claim 3 as follows:

-- 3. A power combiner according to claim 2, wherein said power combiner includes an upper board sized to fit against one end of said housing, and wherein said diode waveguide means is a radially extending strip line disposed thereon. --.

Claim 20, column 12, lines 6 and 7 - after "size" delete "and a radial outward portion of a second cross-sectional size"

Signed and Sealed this

Twelfth Day of August 1980

[SEAL]

Attest:

SIDNEY A. DIAMOND

Attesting Officer

Commissioner of Patents and Trademarks